(12) United States Patent
Ota et al.

(10) Patent No.: US 7,777,292 B2
(45) Date of Patent: Aug. 17, 2010

(54) SEMICONDUCTOR DEVICE

(75) Inventors: Chiharu Ota, Tokyo (JP); Johji Nishio, Machida (JP); Tetsuo Hatakeyama, Yokohama (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/821,740

(22) Filed: Jun. 25, 2007

(65) Prior Publication Data

US 2008/0001159 A1    Jan. 3, 2008

(30) Foreign Application Priority Data

Jun. 30, 2006    (JP) .............................. 2006-182703

(51) Int. Cl.
*H01L 31/0312*    (2006.01)
*H01L 29/47*    (2006.01)
*H01L 29/06*    (2006.01)
*H01L 29/872*    (2006.01)

(52) U.S. Cl. .................... 257/472; 257/77; 257/473; 257/484; 257/485; 257/490; 257/493; 257/494; 257/495; 257/E29.009; 257/E29.013; 257/E29.023; 257/E29.148; 257/E29.338; 257/E27.04; 257/E21.047; 257/E21.064; 257/E21.351; 257/E21.359; 257/E21.368; 438/534; 438/571; 438/573; 438/582

(58) Field of Classification Search .................. None
See application file for complete search history.

(56) References Cited

U.S. PATENT DOCUMENTS 4,134,123 A * 1/1979 Shannon ...................... 257/484
6,037,632 A * 3/2000 Omura et al. ................ 257/341
6,639,260 B2   10/2003 Suzuki et al. ................ 257/288

(Continued)

FOREIGN PATENT DOCUMENTS

EP    1 111 685 A1    6/2001

(Continued)

OTHER PUBLICATIONS

Nishio et al. Ultralow-Loss SiC Floating Junction Schottky Barrier Diodes (Super-SBDs). Aug. 2008. IEEE Transactions on Electron Devices. vol. 55, No. 8. pp. 1954-1960.*

(Continued)

*Primary Examiner*—Andy Huynh
*Assistant Examiner*—Hoang-Quan T Ho
(74) *Attorney, Agent, or Firm*—Ohlandt, Greeley, Ruggiero & Perle, L.L.P.

(57) ABSTRACT

A semiconductor device includes a semiconductor substrate of a first conductivity type having a top surface and a bottom surface, a semiconductor layer of a first conductivity type formed on the top surface of the semiconductor substrate, and having an active region and an edge termination region surrounding the active region, a first semiconductor region of a second conductivity type formed in the edge termination region adjacent to an edge of the active region, a second semiconductor region of a second conductivity type buried in the edge termination region in a sheet shape or a mesh shape substantially in parallel with a surface of the semiconductor layer, a first electrode formed on the active region of the semiconductor layer and a part of the first semiconductor region, and a second electrode formed on the bottom surface of the semiconductor substrate.

18 Claims, 8 Drawing Sheets

U.S. PATENT DOCUMENTS

| | | | |
|---|---|---|---|
| 2001/0005031 A1* | 6/2001 | Sakamoto et al. | 257/401 |
| 2004/0173820 A1* | 9/2004 | Kinoshita et al. | 257/200 |
| 2006/0065899 A1* | 3/2006 | Hatakeyama et al. | 257/77 |
| 2006/0118900 A1* | 6/2006 | Zeghbroeck | 257/483 |
| 2007/0045764 A1 | 3/2007 | Hatakeyama et al. | 257/471 |
| 2007/0138482 A1* | 6/2007 | Tanimoto | 257/77 |

FOREIGN PATENT DOCUMENTS

| | | |
|---|---|---|
| JP | 2-65359 | 5/1990 |
| JP | 9-191109 | 7/1997 |
| JP | 9191109 | 7/1997 |
| JP | 11330498 | 11/1999 |

OTHER PUBLICATIONS

Hatakeyama et al. Physical Modeling and Scaling Properties of 4H-SiC Power Devices. Sep. 1-3, 2005. SISPAD. pp. 171-174.*

Saito et al. A Novel Low On-Resistance Schottky-Barrier Diode With p-Buried Floating Layer Structure. May 2004. IEEE Transactions on Electron Devices. vol. 51, No. 5. pp. 797-802.*

English translation of: Nishio et al. Ultra-Low-Loss Silicon Carbide Super Schottky Barrier Diodes. Apr. 2006. Toshiba Review. vol. 61, No. 4. pp. 48-51.*

Saitoh, et al., "*Ultra Low On-Resistance SBD with P-Buried Floating Layer*"; IEEE, 2002, pp. 33-36.

Xing Bi Chen, et al, "*A Novel High-Voltage Sustaining Structure with Buried Oppositely Doped Regions*", IEEE, vol. 47, No. 6, Jun. 2000.

Nishio et al., "*Ultra-Low-Loss Silicon Carbide Super Schottky Barrier Diodes*", Toshiba Review, vol. 61, No. 7, p. 48, Apr. 2006.

Search report from corresponding EP appln. No. 07 012 590.1 dated Feb. 3, 2009.

T. Hatakeyama, et al., "Physical Modeling and Scaling Properties of 4H-SiC Power Devices", Simulation of Semiconductor Processes and Devices, Sep. 2005, pp. 171-174.

Wataru Saito, et al., "A Novel Low On-Resistance Schottky-Barrier Diode With p-Buried Floating Layer Structure", IEEE Transactions on Electron Devices, vol. 52, No. 5, May 2004, pp. 797-802.

* cited by examiner

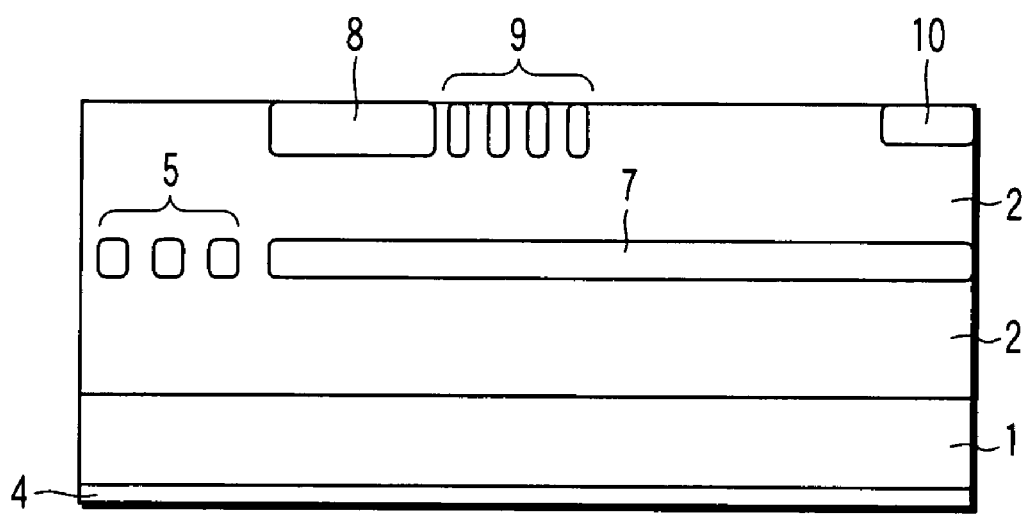
F I G. 7
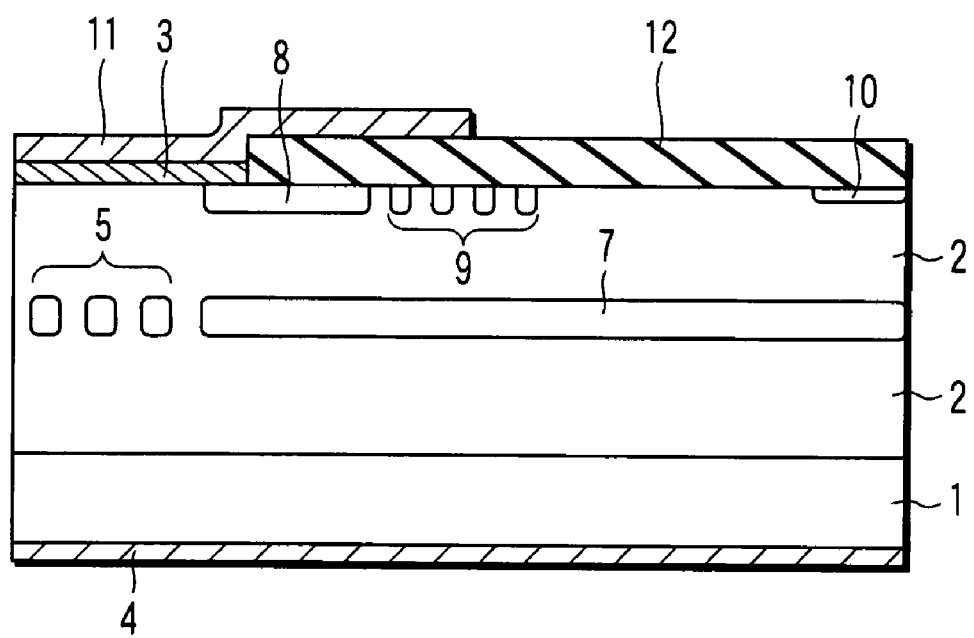
F I G. 8

Inner edge position of p-type buried region where lateral end of RESURF is ZERO and direction toward device edge is plus ($\mu$m)

Outer edge position of p-type buried region where lateral end of RESURF is ZERO and direction toward device center is plus ($\mu$m)

SEMICONDUCTOR DEVICE

CROSS-REFERENCE TO RELATED APPLICATIONS

This application is based upon and claims the benefit of priority from prior Japanese Patent Application No. 2006-182703, filed Jun. 30, 2006, the entire contents of which are incorporated herein by reference.

BACKGROUND OF THE INVENTION

1. Field of the Invention

The present invention relates to a high-voltage semiconductor device which develops a stable breakdown voltage characteristic.

2. Description of the Related Art

Conventionally, a high-voltage diode and a MOSFET have been used as a semiconductor device for electric power control. Such a kind of semiconductor device has been required to improve conflicting characteristics, such as, an improvement in breakdown voltage and a reduction in on-state resistance, and a variety of proposals on this requirement have been offered.

For example, JP-A H9-191109 (KOKAI) discloses a technique which disposes a plurality of stripe-shape p-type buried layers near by the surface of an n-type base layer of a Schottky barrier diode (FIG. 12 of the patent document). This p-type buried layer is designed such that a depletion layer from a Schottky interface reaches the p-type buried layer before the electric field at the Schottky interface reaches maximum electric field of the semiconductor surface.

After that, as raising the reverse bias voltage, the depletion layer reaches the p-type buried layer, the largest point of the electric field at the Schottky interface is fixed not to be raised, and the depletion layer newly spreads onto an ohmic electrode side from the buried layer. Here, the voltage held by the epitaxial layer between the Schottky interface and the buried layer is set to a value lower than the maximum blocking (breakdown) voltage. Thereby, the electric field at the Schottky interface is fixed to a low value, and the leakage current from the Schottky interface may be decreased.

The technique disclosed in the aforementioned patent document disposes a plurality of stages of p-type buried layers as depicted in FIG. 13 of said patent document, shares a breakdown voltage by means of n-type base layers divided by the plurality of stages of p-type buried layers, and develops a Schottky barrier diode which achieves a small voltage drop when conducting at a high voltage.

However, the forgoing conventional improvement is specified only for an active region under an anode electrode, and it does not take so much account to an n-type base layer under an edge termination structure. In other words, specifically, a planer-type high-voltage device, though it has high-voltage performance based on the p-type layer buried in the active region, it poses the problem that the breakdown voltage is determined by an electric field concentration at an edge termination region. If the edge termination structure is microscopic like guard rings, and when widths and intervals of the patterns vary due to a mask misalignment, the problem of lowering in breakdown voltage occurs.

Although such a problem poses, the planer device has many advantages for mass production on those points which are more stable in process, and are higher in yield ration and in throughput than a mesa-type device. Therefore, it has been desired to attain a high-breakdown-voltage device having a planar structure stable in breakdown voltage.

BRIEF SUMMARY OF THE INVENTION

According to one aspect of the invention, there is provided a semiconductor device, which includes:

a semiconductor substrate of a first conductivity type having a top surface and a bottom surface;

a semiconductor layer of a first conductivity type formed on the top surface of the semiconductor substrate, and having an active region and an edge termination region surrounding the active region;

a first semiconductor region of a second conductivity type formed in the edge termination region adjacent to an edge of the active region;

a second semiconductor region of a second conductivity type buried in the edge termination region in a sheet shape or a mesh shape substantially in parallel with a surface of the semiconductor layer.

a first electrode formed on the active region of the semiconductor layer and a part of the first semiconductor region; and a second electrode formed on the bottom surface of the semiconductor substrate.

BRIEF DESCRIPTION OF THE SEVERAL VIEWS OF THE DRAWING

FIGS. 5 to 8 are exemplary longitudinal sectional views for explaining manufacturing process of the diode in the first embodiments step by step;

DETAILED DESCRIPTION OF THE INVENTION

A semiconductor device of the present invention described in the following embodiments is provided with a second semiconductor region of a second conductivity type buried in a sheet shape or a mesh shape in an edge termination region of a semiconductor layer of a first conductivity type substantially in parallel with the surface of the semiconductor layer. When a reverse voltage is applied between a first electrode and a second electrode, equipotential surfaces formed on upper parts of the semiconductor layer being bent toward a direction along the surface of the second semiconductor region so as to be converged with each other. As an electric field distribution is thus formed, the semiconductor device is hard to be broken at the edge termination region and has a stable breakdown voltage characteristic.

Hereinafter, the embodiments of the invention will be described with reference to the drawings.

First Embodiment

Figure 1:
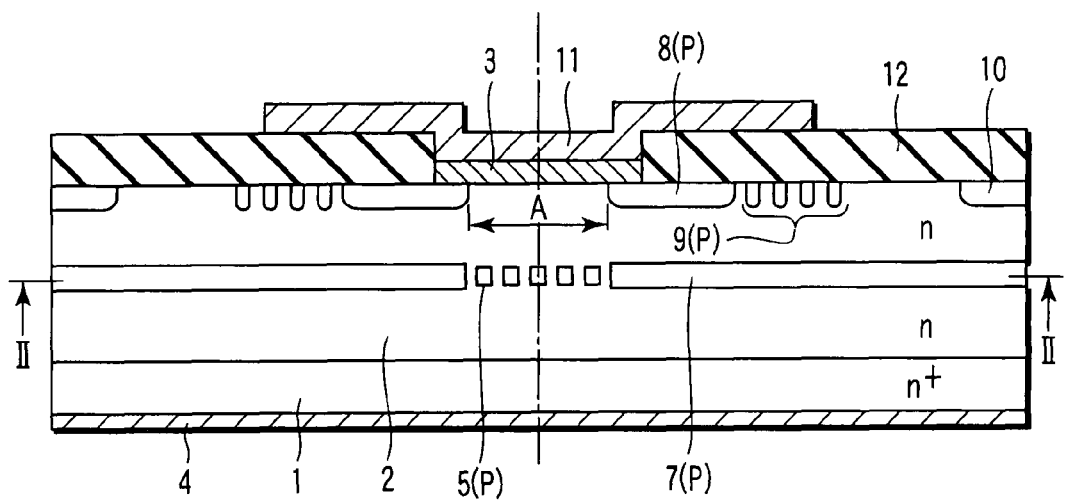
FIG. 1 is an exemplary longitudinal sectional view of one element of a Schottky barrier diode according to the first embodiment.
Figure 2:
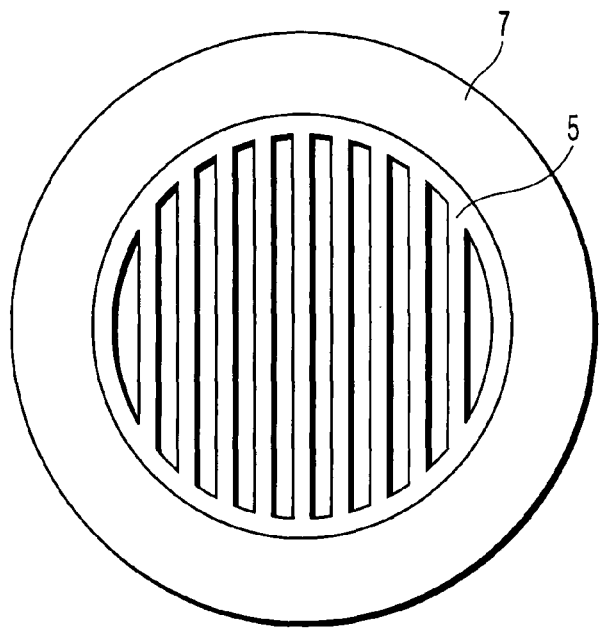
FIG. 2 is an exemplary transverse sectional view along a II-II line of FIG. 1.

FIG. 1 is a longitudinal sectional view of one element of a semiconductor device (vertical Schottky barrier diode) according to the first embodiment. FIG. 2 illustrates a schematic transverse sectional view along a II-II line of FIG. 1, and constituent components of one element of the embodiment are formed in a concentric circle shape in a plane except a component of reference number 5. In FIG. 2, the constituent components may be modified and formed such that components of reference numbers 5 and 7 are made as rectangular rings each with a round (R) at its corners for releasing an electric field concentration.

In further detail, n-type SiC semiconductor layer 2 is formed on a highly doped n$^+$-type SiC semiconductor substrate 1. A RESURF layer 8 containing p-type impurities is formed in an annular shape so as to surround an active region A at a surface central part of the SiC semiconductor layer 2. If further high-breakdown voltage is required, it is preferable to form an edge termination layer (not shown) containing p$^+$ type impurities inside the RESURF layer 8 so as to lie under an anode electrode edge.

P-type guard rings 9 are formed so as to surround the RESURF layer 8 of p-type in order to further enhance the breakdown voltage. In this case, the guard rings 9 of p-type may further enhance effect by disposing a plurality thereof. The sameness of the impurity concentration in the RESURF layer 8 and the guard rings 9 makes easy in a manufacturing process, however it may be different from one another. The semiconductor device may include either the RESURF layer 8 or the guard rings 9.

The surface of the active region surrounded by the RESURF layer 8 is provided with a first electrode 3 so as to be contacted with the surface. The first electrode 3 forms a Schottky junction with the SiC semiconductor layer 2, and uses, for example, Ti as a material. A pad electrode (or a field plate) 11 electrically connected to the first electrode 3 is formed thereon by, for example, Al. The pad electrode (field plate) 11 is formed also above the edge termination structure of the SiC semiconductor layer 2 with the RESURF layer 8 or the guard rings 9 formed thereon through a field plate insulating film 12. The electric field being apt to concentrate to the edge part of the field plate 11 when the reverse electric field is applied thereto, it is preferable to be structured such that the edge part is disposed on the upper part of the RESIRF layer 8 or the guard rings 9. A second electrode 4 is formed on the bottom face of the SiC semiconductor substrate 1 by, for instance, Ni.

In the semiconductor device, p-type semiconductor regions 5 and 7 are buried inside the n-type SiC semiconductor layer 2 in order to be formed in a low-loss structure, namely in a high-breakdown voltage and low on-state resistance structure. In further detail, a p-type region 5 having a plurality of openings is formed in order to have a high breakdown voltage structure and to secure a current path in the active region at the central part of the semiconductor device. As the buried termination structure in the edge termination region, the p-type region 7 is disposed in an electrically continued manner up to a device periphery on the outside of the active region. The periphery of the surface of the n-type semiconductor layer 2 is provided with an edge termination region 10 of a highly doped n$^+$-type semiconductor.

Operations of the semiconductor device will be described hereinafter. When a reverse voltage is applied to the first electrode 3 that is an anode electrode, the depletion layer spreads in the device in the direction toward a second electrode through a Schottky interface, and also it spreads in the direction toward the RESURF layer 8 and the guard rings 9, namely in a lateral direction of the device. The depletion layer extended in the lateral direction spreads in the lateral direction while being pinned by the RESURF layer 8 and the guard rings 9.

After this, the depletion layer reaches the p-type buried regions 5 and 7. The electric field distributes on the buried p-type region 5 only two-dimensionally; however the depletion layer spreads toward the p-type region 7 three-dimensionally. To achieve a high-breakdown voltage device, the electric field on the semiconductor surface should be kept lower than the maximum electric field intensity, and also the depletion layer should not be spread up to the second electrode.

Figure 3:
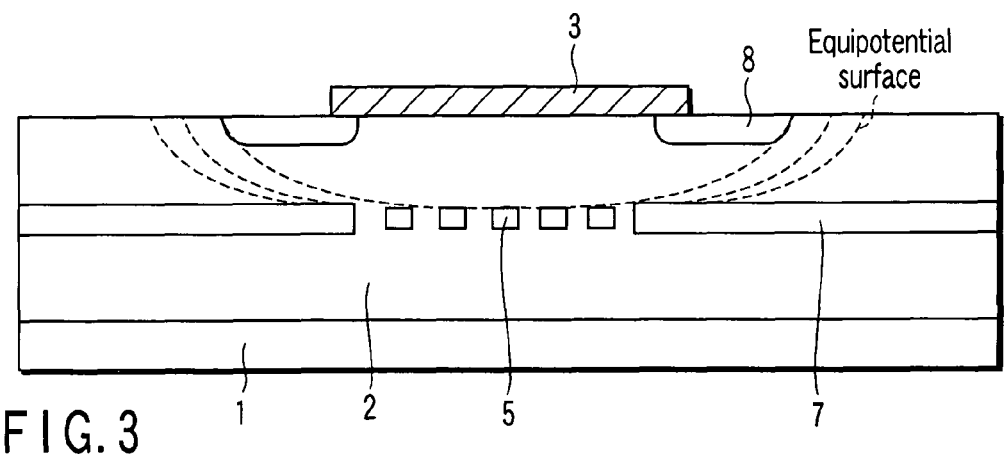
FIG. 3 is an exemplary schematic view depicting equipotential surfaces when a reverse bias is applied to the diode of FIG. 1.
Figure 4:
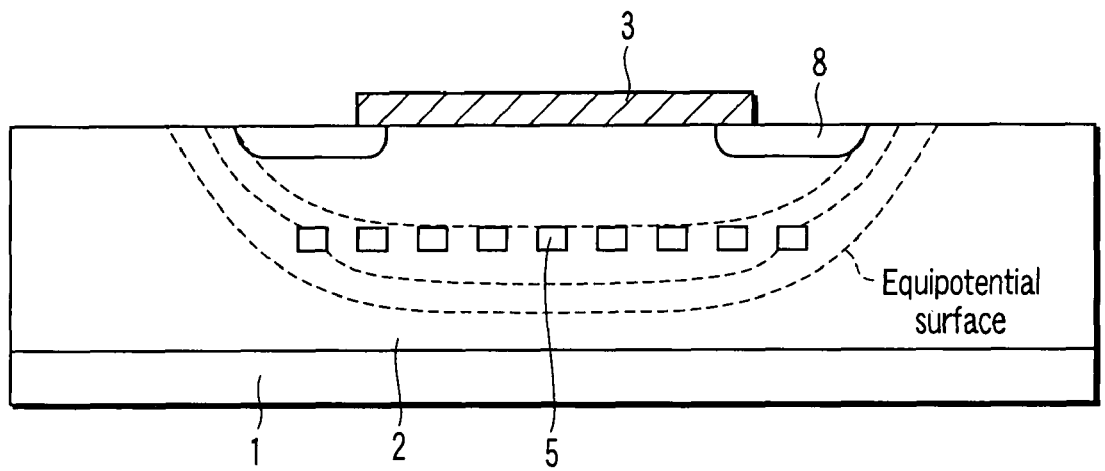
FIG. 4 is an exemplary schematic view depicting equipotential surfaces when a reverse bias is applied to a diode in a comparison example.

In the case in which the p-type buried region 7 like one in this embodiment exists, as depicted in FIG. 3, the equipotential surface spreading in an oblique direction may be bent in a direction further parallel to the surface of the buried region 7, that is, may be bent so as to be converged along with the surface of the buried region 7. Conversely, in the case in which the buried region 7 like this does not exist, or on such a device in FIG. 4 in which the buried regions 5 at the center are formed to extend to the periphery thereof, all of the equipotential surfaces cannot be converged along the surface of the buried regions 5 because gaps (openings) are present in the buried regions 5 at the periphery thereof.

Like this, according to the first embodiment, in comparison to the device including no p-type buried region 7, the depletion layer does not reach the second electrode and a device with a further high breakdown voltage may be achieved. It is preferable for the aforementioned device to be designed such that the maximum electric field intensity becomes larger than the electric field with respect to the p-type buried regions 5 and 7.

Next to this, a manufacturing method of the foregoing semiconductor device will be described by referring to FIGS. 5 to 8. The longitudinal sectional view of the semiconductor of the embodiment is a symmetrical shape capable of being folded at a center line of each of FIGS. 5 to 8, so that only a right half thereof will be illustrated hereinafter to simplify FIGS. 5 to 8.

Figure 5:
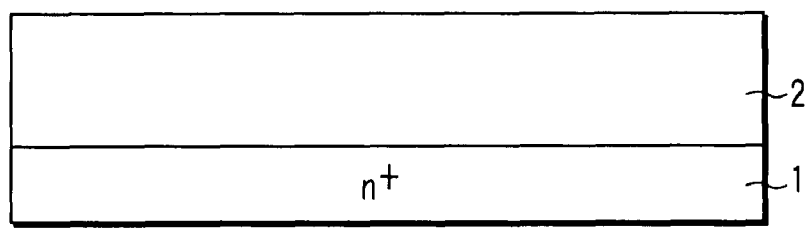

At first, the method, as shown in FIG. 5, forms a film of the n-type SiC layer 2 on the n$^+$ SiC semiconductor substrate 1 by epitaxial growth. Here, the impurity concentration of the n-type SiC substrate 1 is, for example, $3\times10^{15}$ to $3\times10^{16}$/cm$^3$ inclusive, and the present embodiment takes the case of the concentration of $1\times10^{16}$/cm$^3$ as an example. The thickness of the SiC semiconductor layer 2 ranges from several μm to several dozen μm, and this embodiment sets it to 10 μm.

Figure 6:
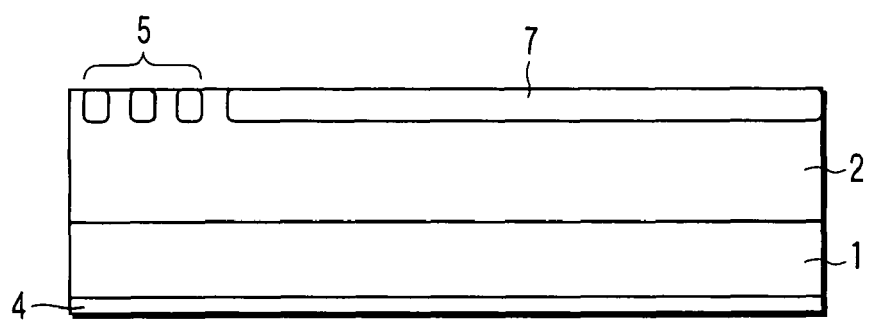

On the n-type SiC layer 2, as illustrated in FIG. 6, the method forms the buried layer 5 under the active region and the buried layer 7 for burying the edge termination region simultaneously. Firstly applying and film-forming a mask material onto the surface of the SiC semiconductor layer 1 to perform patterning forms desired mask patterns (not shown) of the p-type buried regions 5 and 7. Wherein, the mask material uses a resist, a silicon oxide, a silicon nitride, a metal, etc. The method implants ions of p-type impurities through multi-level implantation from the upper surface of the mask material to form the p-type buried regions 5 and 7.

Here, as for p-type ion species, aluminum (Al), boron (B), etc., are usually used; however in the embodiment, Al suitable for a fine pattern is used. As for ion accelerating energy, energy of several keV to several hundred keV is usually used, and in the embodiment, the method uses the ion accelerating energy of 100-360 keV. An ion dose is set to its optimum value by a designed breakdown voltage and an epitaxial concentration, and the method performs Al multi-level ion implantation through the energy of for example, from 100 to 360 keV inclusive with a dose ranging from $1 \times 10^{13}$ to $1 \times 10^{14}/cm^2$ inclusive. In such a case, the method may form a p-type well having a concentration ranging from $1 \times 10^{17}$ to $5 \times 10^{18}/cm^3$ inclusive The case, in which the concentrations of the p-type buried regions 5 and 7 are identical, having described in the given description, both concentrations may be different from each other. If the concentrations are different from each other, after forming the mask of only the p-type buried region 5, and performing the ion implantation into the p-type buried region 5, the method peels off the mask, forms the p-type buried region 7 again, and performs the ion implantation into the p-type buried region 7. Or, after performing the ion implantation into the p-type buried region 7 in first, the method may implant ions into the p-type buried region 5. Therefore, the sameness of the concentrations of the p-type buried regions 5 and 7 makes the method easy in process.

Subsequently, as shown in FIG. 7, the method grows again the upper part of the n-type SiC layer 2 onto the upper surface of the ion implantation surface by the epitaxial growth layer. The concentration and thickness of the upper part of the n-type SiC layer 2 is set to substantially the same as those of the aforementioned lower part of the SiC layer 2. After this, the method forms an $n^+$-type channel stopper layer 10, the p-type RESURF layer 8 and the guard rings 9 on the surface of the n-type SiC layer 2.

The method forms these layers by forming a mask pattern to selectively implanting ions, and it uses nitrogen (N) and phosphorus (P) for n-type ion species. Those doping concentrations being determined by the desired impurity concentration of the n-type SiC layer 2, it is enough for the channel stopper layer 10 to become an $n^+$ layer perfectly, and the doping concentration ranges, for example, from $1 \times 10^{14}$ to $1 \times 10^{16}/cm^2$ inclusive, and here, it is set to $2 \times 10^{15}/cm^2$.

The optimum values of the p-type RESURF layer 8 and the guard rings 9 are set by the designed breakdown voltage and the epitaxial concentration, the dose is set to $1 \times 10^{13}$ to $1 \times 10^{14}/cm^2$ inclusive by Al multi-level ion plantation with, for example, 10-360 keV energy. In this case, the method may form p-type wells having a concentration within a range from $1 \times 10^{17}$ to $5 \times 10^{18}/cm^3$ inclusive. To activate these wells, the method executes activated anneal at a high temperature within a range from 1,500 to 1,700° C. inclusive after ion implantation.

The impurity concentrations of the p-type RESURF layer 8 and the guard ring 9 being set to the same as that of the p-type buried layer 7, they are not always necessary to be the same and they may be different form one another. However, the sameness of the impurity concentrations of the p-type RESURF layer 8 and the guard rings 9 makes the method easy in process.

After this, the method forms a silicon dioxide film 12 through thermal oxidation and a chemical vapor deposition (CVD) oxide film. After this, the method forms the second electrode on the bottom surface. The appropriate electrode material to this forming is a material to be easily ohmic-contacted, here, for example, Ni is used. Furthermore, to make sure the ohmic contact, the method preferably performs a thermal treatment at a high temperature of 900° C. or higher. To lower the contact resistance of the bottom electrode, the method preferably forms a film of a Ti/Ni/Au laminated structure, etc., onto the Ni surface.

The method then selectively performs etching to the silicon oxide film 12 of the surface to open a contact hole and to form a Schottky metal film 3. As for the Schottky metal material, a metallic material to make a Schottky-contact to a SiC face may be preferable, and here, for example, Ti is used. The pad electrode 11 made of Al is formed so as to overlap on the Schottky metal film 3 and also on the silicon oxide film 12. Finally, the method applies passivation (not shown) by polyimide, or the like, as part of a high breakdown voltage structure to complete the element.

In the given description, the case, in which the method performs the multi-level implantation by the low acceleration energy and the re-growing of the drift layer, having been described. If the drift layer has a thickness of 10 μm or less, after growing the drift layer up to the final thickness in first, the method may form the p-type buried region at only a prescribed depth thereof by performing multi-level implantation with high acceleration energy.

Figure 9:
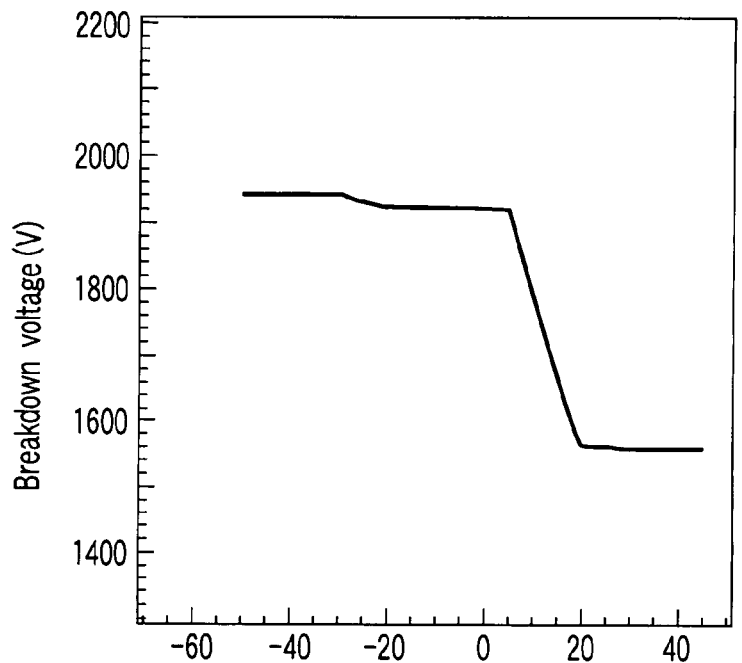
FIG. 9 is an exemplary characteristic view depicting a relation between an inside start point position and a breakdown voltage of a buried p-type region 7.
Figure 10:
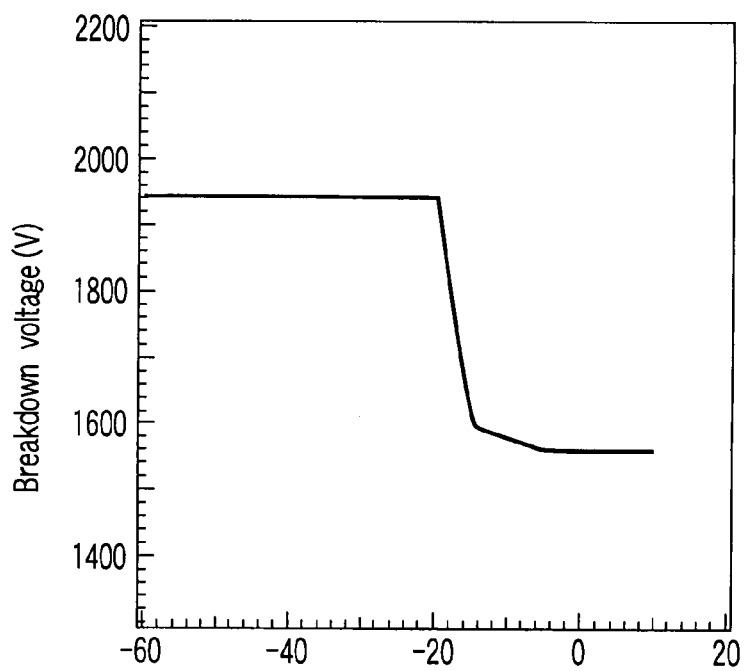
FIG. 10 is an exemplary characteristic view depicting a relation between the breakdown voltage and an outside end point position of the buried p-type region 7.

The first embodiment given above having described about the shape in which the p-type buried region 7 is arranged from almost edge part of the active region (under the inside edge part of the RESURF layer 8) up to the almost edge part of the device, the invention is not limited to this. FIG. 9 shows the result from a simulation of a breakdown voltage by varying a position of a start point (distance outward from active region edge) while fixing the edge of the p-type region 7 in the SiC semiconductor layer 2 to the device edge part. Here, the inside edge of the RESURF layer 8 is adjacent to the active region, and the width of the RESURF layer 8 is set to 50 μm. In addition, the RESURF layer 8 may be larger than 50 μm in width as long as there is some distance between the RESURF layer 8 and the device edge. From FIG. 9, it is revealed that the inner edge of the p-type buried layer 7 located under the RESURF layer 8 makes the breakdown voltage higher. That is, the inner edge of the p-type buried layer 7 is desirably set inside the outer edge of the RESURF layer 8. Of course, the result tells that the inner edge of the p-type buried layer 7 may be inside the active region edge. FIG. 10 illustrates the result of a simulation of a breakdown voltage by varying the edge termination end point while fixing the start point to the active region edge. It is clear that the highest breakdown voltage is attainable in the case where the outside edge of the p-type region 7 is 20 μm or more outside from the outer edge of the RESURF layer 8.

In the first embodiment, the shape, in which the buried p-type region extends from the active region edge to the device edge in a sheet shape, having been described, the invention is not limited to this embodiment. For instance, as shown in FIGS. 11A, 11B to 13A, and 13B, even when the openings are present in the p-type region, if the p-type regions are electrically connected to each other at the edge termination part, an effect to converge the equipotential surfaces on the face of the p-type region is obtained. FIGS. 11A, 11B to 13A, and 13B show mask design for ion implantation, they include radial elements and concentric elements. In the p-type region formed by ion implantation, the radial elements and the concentric elements are integrated (coupled).

Figure 11A:
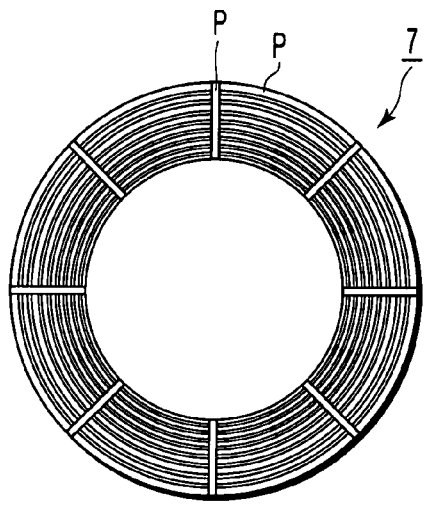
FIGS. 11A and 11B are exemplary pattern examples of the buried p-type regions 7.
Figure 11B:
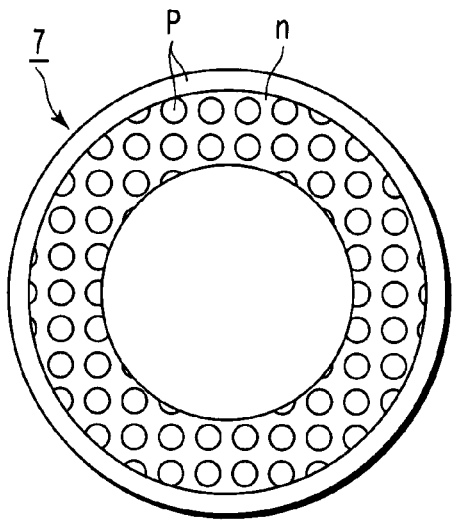

The simple repetitive patterns depicted in FIGS. 11A and 11B being easy to design and manufacture, they are appropriate for the use as long as to obtain the equipotential surfaces. In the case of FIG. 11A, the concentric circle (ring) of p-type layers being coupled by radial p-type layers, the dose of the p-type layers is not so large that the patterns have advantages such that the electric potential of each ring becomes lower gradually, namely the electric fields are easily reduced in proportion to getting outside thereof. Conversely, in the case of dotted shape of FIG. 11B, the patterns have advantages such that the electric fields hardly converge to a specific pattern.

Figure 12A:
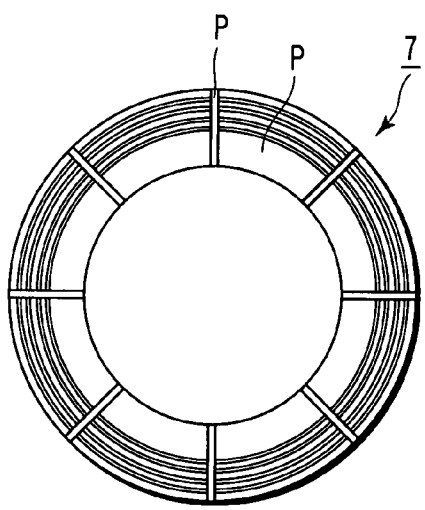
FIGS. 12A to 12C are exemplary other pattern examples of the buried p-type regions 7.
Figure 12B:
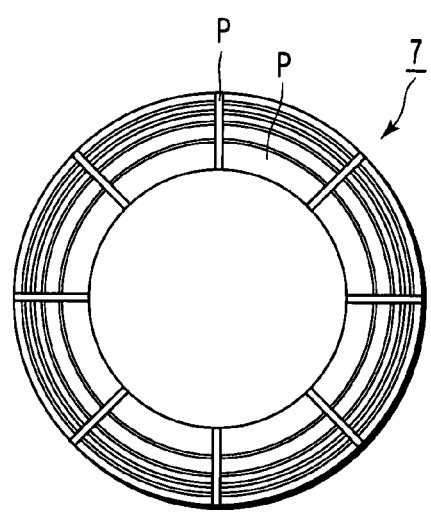
Figure 12C:
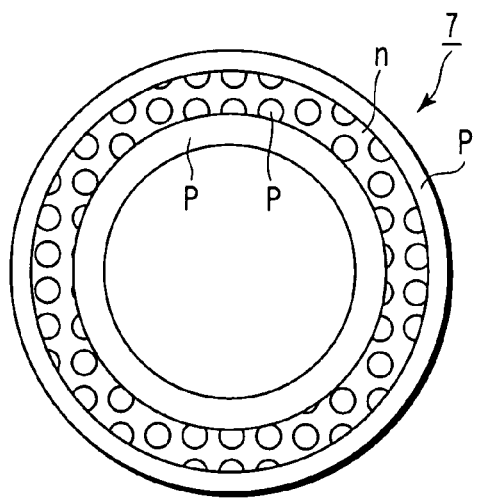
Figure 13A:
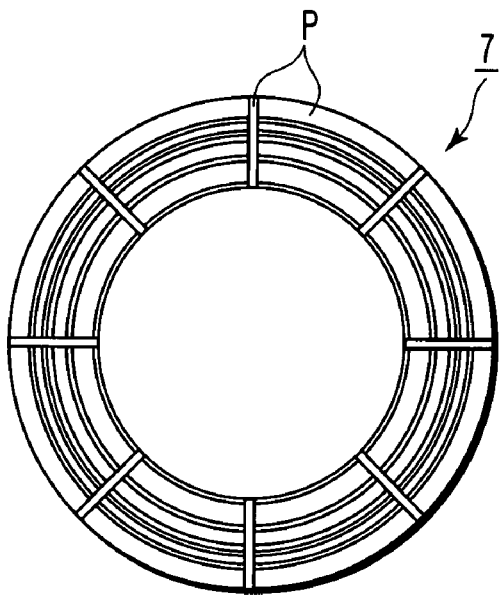
FIGS. 13A, 13B, 14A, 14B, and 15A to 15C are exemplary further other pattern examples of the buried p-type regions 7.
Figure 13B:
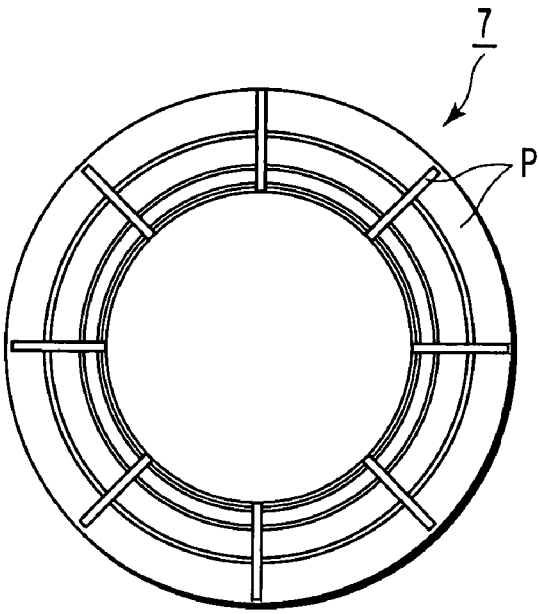

In FIGS. 12A to 12C, the rings of the inside become wide in the diameter directions, these structures are effective for the use that the equipotential surfaces with high electric potentials at just outside the active regions are bent preferably inside the elements. In FIGS. 13A and 13B, the outer most periphery rings become wide in the diameter directions, and such structures are effective for the user to intend to avoid the concentrations of the electric fields at high-voltage center parts, and conversely, intend to bend the equipotential surfaces at the termination region which has become to a lower potential.

Figure 14A:
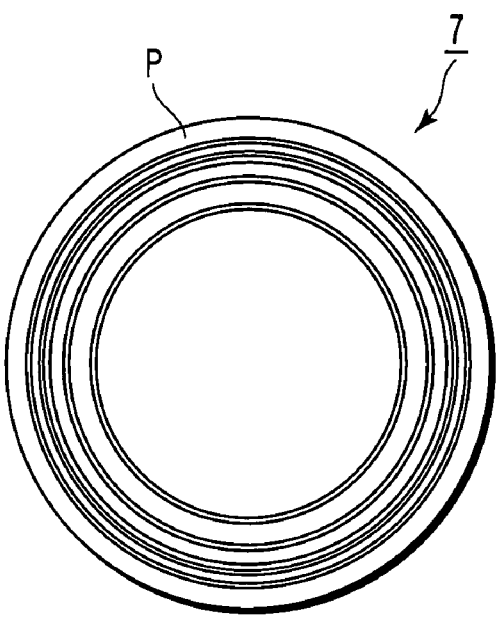
Figure 14B:
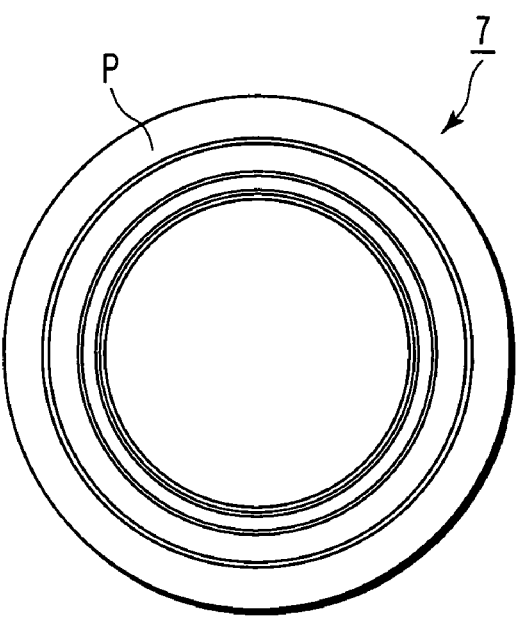
Figure 15A:
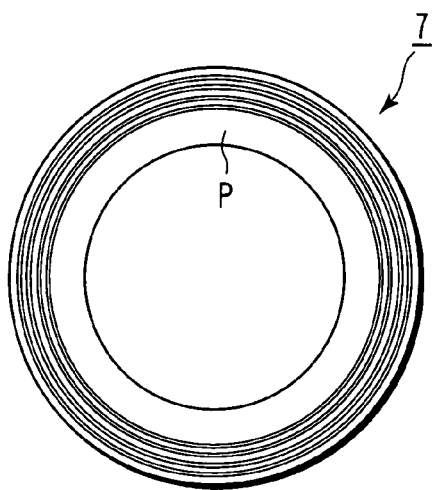
Figure 15C:
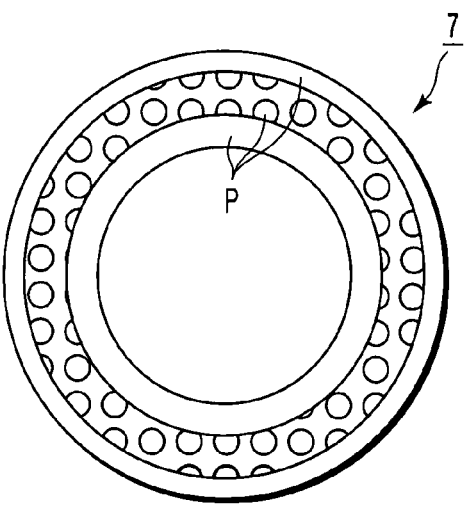

Even if the buried p-type regions 7 have, as shown in FIGS. 14A, 14B, and 15A to 15C, shapes by which each element is not electrically connected to one another, when they are the p-type layers having effects to bend the equipotential surfaces spreading two-dimensionally from the RESURF layers 8 and the guard rings 9 that are the planar type edge termination parts, the shapes have the similar effects. FIGS. 14A and 14B show the examples making the rings at the outsides away from the active regions wide, and FIGS. 15 to 15C show the examples making the rings at the insides wide, and the examples have effects corresponding to each of FIGS. 13, 13B, and 12A to 12C, respectively.

Figure 16A:
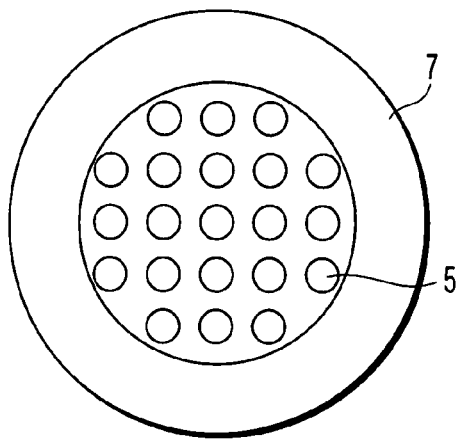
FIGS. 16A to 16C are exemplary pattern examples of buried p-type regions 5.
Figure 15B:
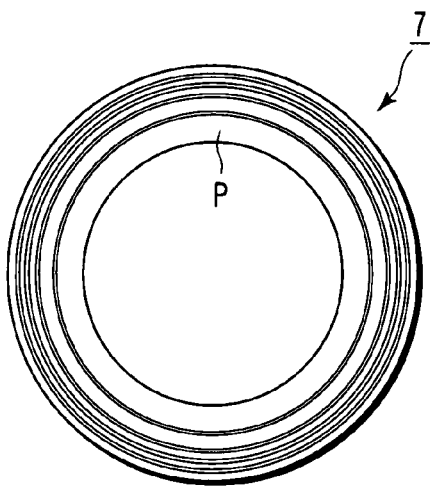
Figure 16B:
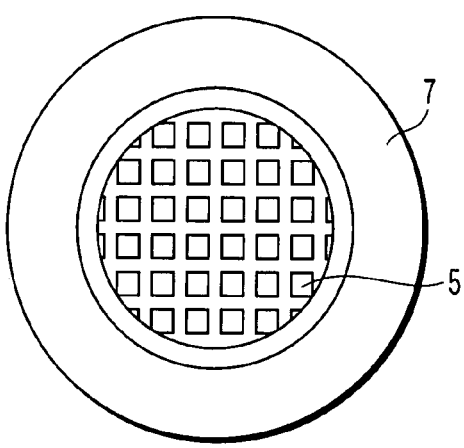
Figure 16C:
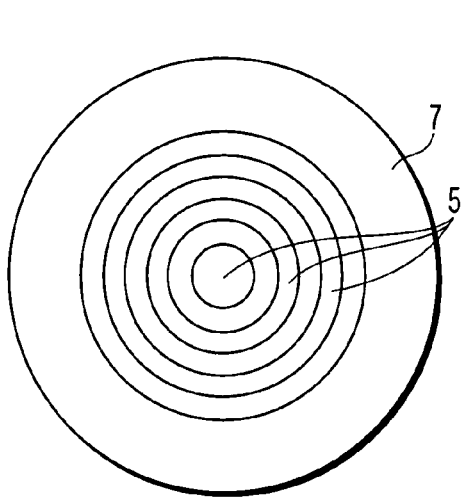

FIG. 2 depicts the shape like a stripe with respect to the p-type region 5 in the active region. However, the invention is not limited to the shape as long as the openings providing the current path in the p-type region 5, and a variety of variations shown in FIGS. 16A to 16C are possible approaches. FIG. 16A illustrating the p-type region 5 having a dotted shape, dots may be formed of n-type and the peripheries thereof may be formed of p-type. FIG. 16B showing the p-type region 5 shaped in grid, in a similar way to FIG. 16A, the p-type region and the openings may be reversed. FIG. 16C shows the p-type region 5 with a ring shape. Like this, the openings in the p-type region 5 include openings completely surrounded by the p-type region 5 and the openings the part of which is surrounded by the p-type region 5.

When the p-type region 7 is formed like a ring shape in the outside of the p-type region 5 and is continuously formed from the active region edge to the device edge as shown in FIG. 1, contacting of any one point of the p-type region 7 with the equipotential surface brings the whole of the p-type region 7 into an equipotential surface, so that the electric field concentration hardly occurs. The occurrence points of side etching in processing is limited to both side faces of the ring, so that the electric field concentration based on the etching shape is suppressed at minimum. When the p-type region 5 is formed in a dot pattern, the plural p-type regions can be separately disposed. Thus, the high breakdown voltage is attained by a smaller area. Further, it has an advantage to allow reducing the on-state resistance. Conversely, when the n-type region of the active region is formed in a dot pattern, the electric potential of the p-type regions 5 of a net-shape is made equal at any position therein, and the advantage of the buried p-type region is easily given. The ring shape has an advantage to easily ensure the matching property with the edge termination structure. Furthermore, even when no p-type region 5 exists at all, the breakdown voltage may be maintained by the effect of the p-type layer 7.

As mentioned above, according to the first embodiment, since the diode includes the p-type buried region 7 buried in the edge termination region in a sheet shape or a mesh shape substantially in parallel with the surface of the n-type SiC layer 2, when the reverse voltage is applied to the anode electrode 3, and the equipotential surfaces formed at the upper part of the SiC layer 2 being bent toward the direction along the surface of the p-type buried region 7 and also bent so as to converge with one another, the diode becomes possible to have the stable high breakdown voltage characteristic.

Second Embodiment

Figure 17:
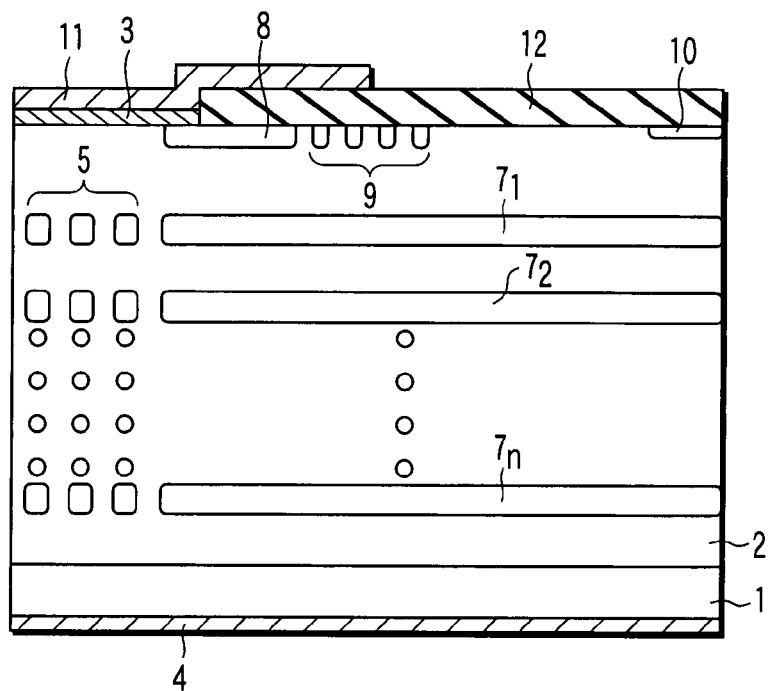
FIG. 17 is an exemplary longitudinal sectional view of a Schottky barrier diode according to the second embodiment.

The structure of the first embodiment is such a structure in which only one layer of the p-type regions 5 and 7 is disposed in the n-type SiC layer 2. However, a plurality of stages of p-type buried regions may be disposed in the n-type SiC layer 2. FIG. 17 is a cross-sectional view of a semiconductor device according to a second embodiment, and in a similar manner to the first embodiment, the same components as those of the first embodiment are designated by identical numbers to eliminate duplicated descriptions.

The semiconductor in the second embodiment is also the Schottky barrier diode, and plurality (number n) of the p-type buried layers 5 and 7 are disposed in the n-type SiC layer 2 that is the drift layer. Also in such a device structure, optimizing the impurity concentration and the thickness of the drift layer 2, and optimizing the impurity concentration of the p-type buried regions enable each of the drift layers divided by the plurality (number n) of the p-type buried layers 5 and 7 to share the breakdown voltage, and offers a device with a high breakdown voltage and a low leakage current.

Third Embodiment

Figure 18:
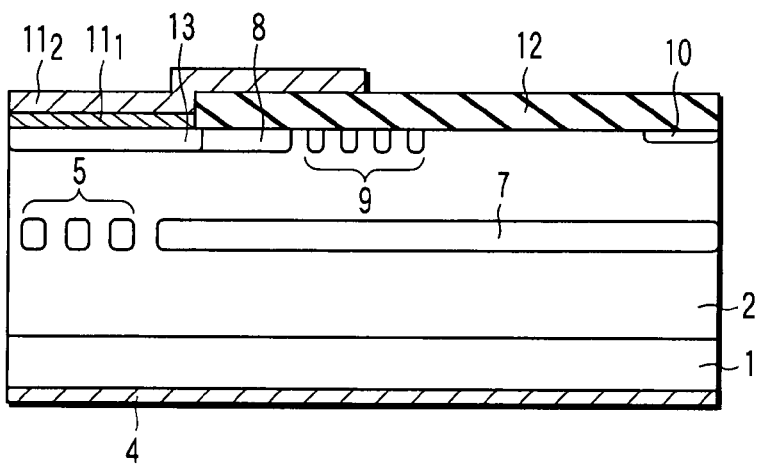
FIG. 18 is an exemplary longitudinal sectional view of a pn diode according to the third embodiment.

FIG. 18 is a cross-sectional view of a semiconductor device of the third embodiment, and depicts an embodiment in which the present invention is applied to a pn diode. The reference numbers 13, $11_1$ and $11_2$ indicate a p-type anode region, an Ni anode electrode, and a pad electrode (field plate) of Ti/Al, respectively. The same components as those of the first embodiment are designated by identical numbers and duplicated descriptions are omitted.

In the third embodiment, the p-type region 13 on the semiconductor surface ohmic-contacting with the anode electrode $11_1$, the dose in the p-type region 13 has to be larger than that of the RESURF layer 8. It is preferable for the impurity concentrations of the RESURF layer 8 and the guard rings 9 to be optimally designed so as to match with the impurity concentration of the p-type region 13.

Also in the third embodiment, the pn diode with a stable breakdown voltage characteristic may be offered by disposing the p-type buried layer 7 that is an equipotential surface convergence structure.

Fourth Embodiment

Figure 19:
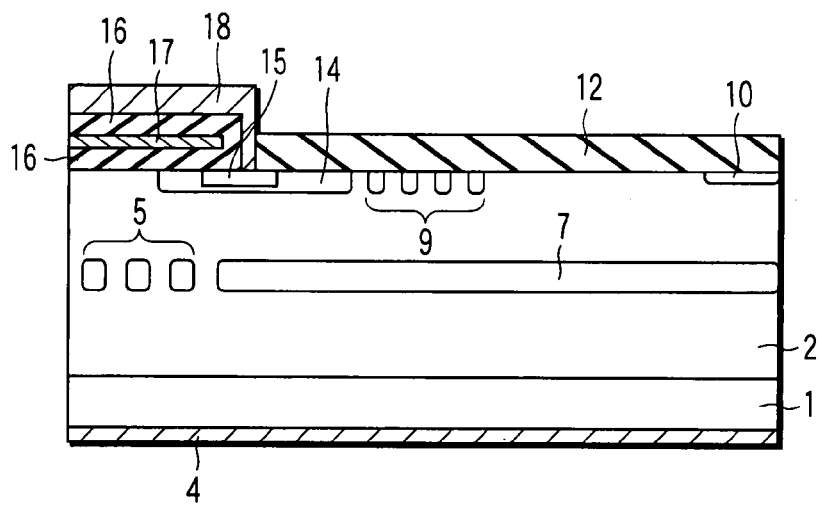
FIG. 19 is an exemplary longitudinal sectional view of a vertical MOSFET according to the fourth embodiment.

FIG. 19 is a cross-sectional view of a semiconductor device according to the fourth embodiment, and shows an embodiment in which the invention is applied to a vertical MOSFET. FIG. 19 shows a p-type region 14, an n-type source region 15, a (gate) insulating region 16, a gate electrode 17, and a source electrode (first electrode) 18. Other than these, the same components as those of the first embodiment are designated by identical numbers and duplicated descriptions are skipped, and the reference number 4 indicates the drain electrode (second electrode). Disposing the n-type SiC semiconductor layer 2 onto the p-type SiC semiconductor substrate 1 enables composing an IGBT.

In the fourth embodiment, disposing the p-type buried region 7 that is an equipotential surface convergence structure in an edge termination region allows achieving a vertical MOSFET having a stable breakdown voltage characteristic.

The invention having been described through the embodiments, the semiconductor material is not limited to SiC; it goes without saying that adaptation to Si, GaN, diamond, etc., are effective similarly. The conductivity type of the substrate and semiconductor layer may be reversible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate of a first conductivity type having a top surface and a bottom surface;
   a semiconductor layer of a first conductivity type formed on the top surface of the semiconductor substrate, and having an active region and an edge termination region surrounding the active region;
   a first semiconductor region of a second conductivity type formed in the edge termination region adjacent to an edge of the active region, the second conductivity type being opposite the first conductivity type;
   a second semiconductor region of the second conductivity type buried in the edge termination region in a mesh shape substantially in parallel with a surface of the semiconductor layer so as to include a plurality of concentric circular layers of the second conductivity type that are coupled by radially extending layers of the second conductivity type;
   a fourth semiconductor region of the first conductivity type formed on a peripheral edge surface of the semiconductor layer so as to surround the first semiconductor region with a space and has an impurity concentration higher than that of the semiconductor layer;
   a first electrode formed on the active region of the semiconductor layer and a part of the first semiconductor region;
   an insulating layer covering the semiconductor layer so as to surround the first electrode; and
   a second electrode formed on the bottom surface of the semiconductor substrate.

2. The device according to claim 1, wherein an impurity concentration of the first semiconductor region is substantially equal to that of the second semiconductor region, and the first semiconductor region functions as a RESURF region.

3. The device according to claim 1, further comprising:
   a third semiconductor region of a second conductivity type at a substantially same depth as that of the second semiconductor region in the active region of the semiconductor layer.

4. The device according to claim 3, wherein the third semiconductor region includes a plurality of openings.

5. The device according to claim 1, wherein equipotential surfaces formed in an upper portion of the semiconductor layer are bent along a surface of the second semiconductor region to be converged with one another when a reverse voltage is applied between the first electrode and the second electrode.

6. The device according to claim 1, further comprising:
   a guard ring of a second conductivity type formed on the edge termination region of the semiconductor layer so as to surround the first semiconductor region with a space.

7. The device according to claim 1, wherein the second semiconductor region includes a plurality of openings to form a mesh region.

8. The device according to claim 1, wherein the semiconductor substrate and the semiconductor layer are formed of SiC.

9. The device according to claim 8, wherein an inner edge of the second semiconductor region is set inside an outer edge of the first semiconductor region and an outer edge of the second semiconductor region is set 20 μm or more outside the outer edge of the first semiconductor region.

10. The device according to claim 8, wherein an impurity concentration of the second semiconductor region falls in a range between $1\times10^{17}/cm^3$ inclusive and $5\times10^{18}/cm^3$ inclusive.

11. The device according to claim 8, wherein an impurity concentration of the third semiconductor region falls in a range between $1\times10^{17}/cm^3$ inclusive and $5\times10^{18}/cm^3$ inclusive.

12. A semiconductor device, comprising:
   a semiconductor substrate of a first conductivity type having a top surface and a bottom surface;
   a semiconductor layer of a first conductivity type formed on the top surface of the semiconductor substrate, and having an active region and an edge termination region surrounding the active region;
   a RESURF region of a second conductivity type formed in the edge termination region adjacent to an edge of the active region, the second conductivity type being opposite the first conductivity type;
   a guard ring formed in the semiconductor layer so as to surround the RESURF region with a space;
   a first buried semiconductor region of the second conductivity type buried in the edge termination region in a mesh shape substantially in parallel with a surface of the semiconductor layer so as to include a plurality of concentric circular layers of the second conductivity type which are coupled by radially extending layers of the second conductivity type;
   a channel stopper region of the first conductivity type formed at a peripheral edge of the semiconductor layer so as to surround the guard ring with a space and has an impurity concentration higher than that of the semiconductor layer;
   a first electrode formed on the active region of the semiconductor layer and a part of the RESURF region;
   an insulating layer covering the semiconductor layer so as to surround the first electrode; and a second electrode formed on the bottom surface of the semiconductor substrate.

13. The device according to claim 12, further comprising:

a second buried semiconductor region of a second conductivity type buried at the substantially same depth as that of the first buried semiconductor region in the active region inside the RESURF region.

14. The device according to claim 12, wherein equipotential surfaces formed in an upper portion of the semiconductor layer are bent along a surface of the first buried semiconductor region to be converged with one another, when a reverse voltage is applied between the first electrode and the second electrode.

15. The device according to claim 12, wherein the first buried semiconductor region includes a plurality of openings to form a mesh region.

16. The device according to claim 12, wherein the semiconductor substrate and the semiconductor layer are formed of SiC.

17. The device according to claim 16, wherein an impurity concentration of the first buried region falls in a range between $1 \times 10^{17}/cm^3$ inclusive and $5 \times 10^{18}/cm^3$ inclusive.

18. The device according to claim 16, wherein an impurity concentration of the second buried region falls in a range between $1 \times 10^{17}/cm^3$ inclusive and $5 \times 10^{18}/cm^3$ inclusive.

* * * * *